United States Patent
Kim

(10) Patent No.: US 8,440,346 B2
(45) Date of Patent: May 14, 2013

(54) PROTECTION CIRCUIT BOARD FOR SECONDARY BATTERY AND SECONDARY BATTERY USING THE PROTECTION CIRCUIT BOARD

(75) Inventor: Woochoul Kim, Yongin-si (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 320 days.

(21) Appl. No.: 12/074,065

(22) Filed: Feb. 29, 2008

(65) Prior Publication Data

US 2008/0226980 A1    Sep. 18, 2008

(30) Foreign Application Priority Data

Mar. 15, 2007    (KR) .................. 10-2007-0025642

(51) Int. Cl.
*H01M 2/00*    (2006.01)

(52) U.S. Cl.
USPC ......................................... 429/163; 320/134

(58) Field of Classification Search ...... 429/7, 122–347; 320/73–79, 136, 134
See application file for complete search history.

(56) References Cited

U.S. PATENT DOCUMENTS

| | | | | |
|---|---|---|---|---|
| 4,435,611 A | * | 3/1984 | Ohsawa et al. | 174/257 |
| 4,667,266 A | * | 5/1987 | Masuoka et al. | 361/212 |
| 5,029,041 A | * | 7/1991 | Robinson et al. | 361/220 |
| 5,909,104 A | * | 6/1999 | Scott | 320/136 |
| 5,912,092 A | | 6/1999 | Maruyama et al. | |
| 2004/0251872 A1 | * | 12/2004 | Wang et al. | 320/112 |
| 2005/0073781 A1 | * | 4/2005 | Hsu et al. | 361/56 |
| 2006/0208850 A1 | | 9/2006 | Ikeuchi et al. | |
| 2006/0227521 A1 | * | 10/2006 | Nam et al. | 361/780 |
| 2006/0250731 A1 | | 11/2006 | Parkhurst et al. | |

FOREIGN PATENT DOCUMENTS

| | | |
|---|---|---|
| CN | 1522103 | 8/2004 |
| CN | 1890824 | 1/2007 |
| JP | 2002-124235 | 4/2002 |
| JP | 2005-339966 | 12/2005 |
| JP | 2006-172942 | 6/2006 |
| KR | 1020060037840 | 5/2006 |
| KR | 1020060047592 | 5/2006 |

OTHER PUBLICATIONS

European Search Report issued by EPO on Jul. 5, 2012 in connection with European Patent Application No. 08102221.2, which also claims Korean Patent Application Serial No. 10-2007-0025642 as its priority document.

* cited by examiner

*Primary Examiner* — Basia Ridley
*Assistant Examiner* — Jonathan G Leong
(74) *Attorney, Agent, or Firm* — Robert E. Bushnell, Esq.

(57) ABSTRACT

A protection circuit board for a secondary battery includes an insulation substrate, a protection circuit part including an electrode tap connection terminal and a charge/discharge terminal, arranged on the insulation substrate, and a printed circuit board including a passive element and a positive element, connected to a printed circuit board pattern. A static electricity absorbing part is arranged at a periphery of the printed circuit board pattern.

16 Claims, 4 Drawing Sheets

PROTECTION CIRCUIT BOARD FOR SECONDARY BATTERY AND SECONDARY BATTERY USING THE PROTECTION CIRCUIT BOARD

CLAIM OF PRIORITY

This application makes reference to, incorporates the same herein, and claims all benefits accruing under 35 U.S.C. §119 from an application for PROTECTION CIRCUIT BOARD FOR SECONDARY BATTERY AND SECONDARY BATTERY USING THE SAME, earlier filed in the Korean Intellectual Property Office on 15 Mar. 2007 and there duly assigned Serial No. 2007-0025642.

BACKGROUND OF THE INVENTION

1. Field of the Invention

The present invention relates to a secondary battery. More specifically, the present invention relates to a protection circuit board for a secondary battery for preventing damage to the protection circuit board from static electricity and a secondary battery using the protection circuit board.

2. Description of the Related Art

Now, portable electric/electronic apparatus, which have become more compact and lighter, such as cellular phones, notebook computers and camcorders are being actively developed and produced. Portable electric/electronic apparatus install a battery pack so as to work even in a place where no external power source is available. Considering the economic factor, the above battery pack recently adopts a chargeable/rechargeable secondary battery. Also, a secondary battery is being used in hybrid cars which need high density energy and high power. Therefore, secondary batteries are now being studied, developed and produced.

Ni—Cd batteries, Ni-MH batteries, Li batteries and Li-ion batteries are representative secondary batteries.

More particularly, a Li-ion battery has an operating voltage approximately 3 times higher than that of a Ni—Cd battery or a Ni—MH battery which is frequently used as a portable electronic apparatus power source. Also, it is widely used since it has high energy density per unit weight. The Li-ion battery usually employs a Li-based oxide as anode active material and a carbonic material as cathode active material. Generally, according to the kinds of electrolyte, secondary batteries are classified into liquid electrolyte batteries and high polymer electrolyte batteries. Batteries using a liquid electrolyte are called Li-ion batteries while those using a high polymer electrolyte are called Li-polymer batteries. Also, Li secondary batteries are being produced in various shapes. Representatively, there are cylinder-shaped, square-shaped and pouch-shaped batteries.

Considering stability, the secondary battery is used together with a protection circuit board. For the protection circuit board used in a secondary battery, a printed circuit board pattern is formed and a plurality of electric elements and a protection circuit are attached to the printed circuit board pattern. A static electricity test is performed to test the stability of the protection circuit board.

The generation of static electricity burns or melts electric elements and a protection circuit which are mounted on a protection circuit board and causes short circuits and errors in the protection circuit board.

SUMMARY OF THE INVENTION

In order to resolve aforementioned problems, the object of the present invention is to prevent the electric elements and electric circuit mounted on a protection circuit board from losing their function due to static electricity.

In order to achieve aforementioned object, a protection circuit board for a secondary battery is provided, the protection board including: an insulation substrate; a protection circuit part including an electrode tap connection terminal and a charge/discharge terminal, arranged on the insulation substrate, and a printed circuit board including a passive element and a positive element, connected to a printed circuit board pattern; and a static electricity absorbing part arranged at a periphery of the printed circuit board pattern.

The static electricity absorbing part may be connected to the ground pattern of a printed circuit board pattern.

The protection circuit board may further include a test terminal arranged on the printed circuit board pattern.

The protection circuit board may further include a conductor connected to the static electricity absorbing part. The conductor may include one material selected from Cu, Al, Ni and stainless steel. The conductor may include a conductive paste.

In order to achieve aforementioned object, a secondary battery is provided, the secondary battery including: an electrode assembly, including an anode plate connected to an anode tap, a cathode plate connected to a cathode tap and a separator interposed between the anode plate and the cathode plate; a can, including one open end part to accept the electrode assembly; a cap assembly including an electrode terminal electrically connected to the cathode tap and a cap plate electrically connected to the cathode tap; a lid electrode part electrically connected to the electrode terminal and the cap plate; a protection circuit board including an insulation substrate, a printed circuit board pattern arranged on the insulation substrate and electrically connected to the lid electrode part; a protection circuit part electrically connected to the printed circuit board pattern; a charge/discharge terminal arranged on the insulation substrate and electrically connected to the printed circuit board pattern; and the protection circuit board including a test terminal arranged on the insulation substrate, and electrically connected to the printed circuit board pattern including an electroless plated layer arranged thereon; and a resin molding part including molding of the protection circuit board with a melting resin to expose a surface of the charge/discharge terminal.

The a secondary battery may further include a test terminal arranged on the printed circuit board pattern.

The resin molding part may expose a terminal surface of the test terminal.

The secondary battery may further include an aperture arranged within the resin molding part, the aperture passing from the external surface to the static electricity absorbing part.

The static electricity absorbing part may be connected to a ground pattern of the printed circuit board pattern.

The secondary battery may further include a conductor connected to the static electricity absorbing part. The conductor may include one material selected from Cu, Al, Ni and stainless steel. The conductor may include a conductive paste.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein:

FIG. 1b is a perspective view of the upside-down protection circuit board of FIG. 1a.

DETAILED DESCRIPTION OF THE INVENTION

Hereinafter, the embodiments according to the present invention are explained in detail with reference to the accompanying drawings.

Figure 1A:
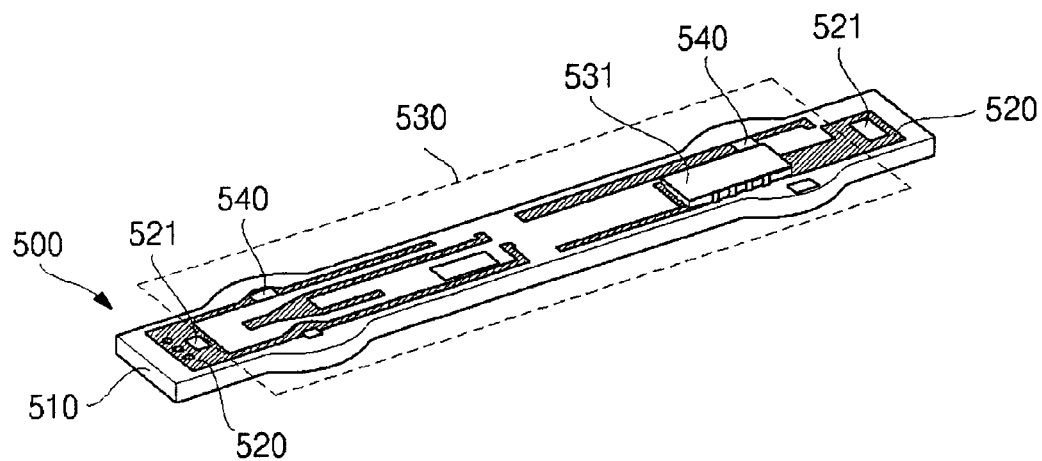
FIG. 1a is a perspective view of a protection circuit board according to an embodiment of the present invention.
Figure 1B:
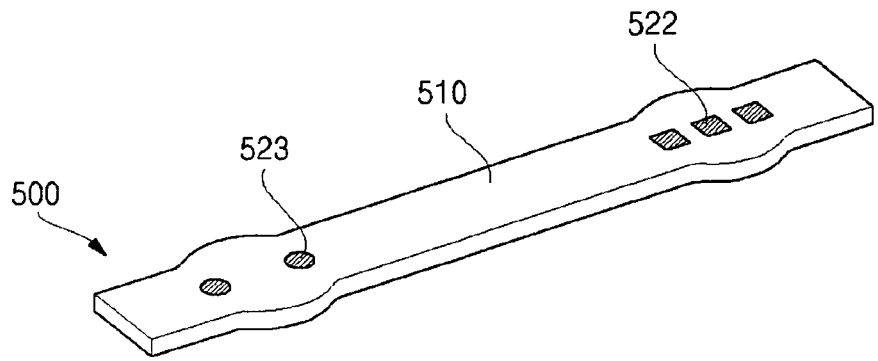

Referring to Figs. 1a and 1b, the protection circuit board 500 for a secondary battery of the present invention includes an insulation substrate 510, a printed circuit board pattern 520 forming an electrode contact part 521 mounted on the insulation substrate 510, a charge/discharge terminal 522 and a test terminal 523, a protection circuit part 530 comprising a passive element (not shown) and a positive element (not shown), which are connected to the printed circuit board pattern 520, and a protection circuit 531 and a static electricity absorbing part 540 formed on the printed circuit board pattern 520.

The insulation substrate 510 may be plate-shaped. The material thereof may be an epoxy or bakelite resin. The insulation substrate 510 may be formed of a plurality of depositions. Also, after a printed circuit board pattern 520 or a protection circuit part 530 is mounted, a thin insulation film may be formed by coating an insulation material.

A printed circuit board pattern 520 may be formed such that a conductive thin film is mounted on the insulation substrate 510. Regarding the printed circuit board pattern 520, a printed pattern functions as an electrode connection part 521 electrically connected to a secondary battery (not shown), a charge/discharge terminal 522 connected to an external appliance (not shown) and an electric connection line. Also, a printed pattern for transmitting information regarding the condition of the battery to an external appliance may be formed. Furthermore, the printed pattern may be formed from the plurality of deposited insulation substrates.

The protection circuit part 530 may include a passive element, a positive element and a protection circuit. Also, it may be soldered on the printed circuit board pattern 520.

A passive element can use a resistor or a capacitor, which is connected to a printed circuit board pattern 520 by a connection method, such as soldering or the like. The passive element is electrically connected to a protection circuit 530, functions as a filter for filtering signals, buffers a voltage and a current, or provides information, such as a resistor value, to an external appliance (not shown).

A positive element may include a diode together with a Metal Oxide Semiconductor Field Effect Transistor (MOSFET) or a transistor TR, which functions as a switch for an electrical connection with an external appliance (not shown). Also, a voltage, a current or a temperature element for measuring the condition of a second battery, or a voltage supply element for supplying a stable voltage to a protection circuit may be used. Also, these positive elements may be integrated into integrated circuit. Also, a thermal fuse for cutting off a current when a temperature increases excessively, a thermal breaker and a Positive Temperature Coefficient (PTC) safety element can be used selectively.

The protection circuit 531, which is electrically connected to a passive element and a positive element, manages the overall condition of a secondary battery, checks residual stored energy of the secondary battery, charges or discharges it with a proper charge method, and stores information, such as voltage, current, temperature and battery residual stored energy, regarding the condition of the secondary battery in order to send the information by communicating with an external appliance.

The static electricity absorbing part 540 according to the present invention may be formed at the periphery of the printed circuit board pattern 520. Since the ground resistance of the static electricity absorbing part 540 is low, it is easy to absorb the static electricity being introduced from the outside. Referring to FIG. 1a, at least one static electricity absorbing part 540 is prepared on the printed circuit board pattern 520 formed at the periphery of a protection circuit 531. The static electricity absorbing part 540 protects a protection circuit 531 by absorbing static electricity being introduced from the outside.

Also, a static electricity absorbing part 540 is further prepared on the periphery of the printed circuit board pattern 520 being connected to a passive element or a positive element of a protection circuit part 530 so as to absorb the static electricity being introduced.

Also, the static electricity absorbing part 540 may connect to the ground pattern of the printed circuit board pattern 520. The static electricity absorbing part 540 connected to the ground pattern may buffer the static electricity power by causing the absorbed static electricity to flow on the ground pattern. The size of at least a part of the ground pattern of the printed circuit board pattern 520 connected to the static electricity absorbing part 540 may be enlarged. Thus, when the static electricity introduced into the static electricity absorbing part 540 is not discharged to the outside, the wide ground pattern disperses electric charges of the static electricity so as not to generate a spark and to absorb the electrical charges of the static electricity.

Also, a test terminal 523 may be further formed on the printed circuit board pattern 520. The test terminal 523 is used as an electrical passage which sends the condition of a secondary battery (not shown) to the outside. If static electricity is introduced into the printed circuit board pattern 520 connected to the test terminal 523, wrong information is sent to an external appliance 2 (not shown) causing erroneous operation. In order to prevent this problem, if a static electricity 3 absorbing part 540 is formed at the periphery of a printed circuit board pattern 520 connected to a test terminal 523, the influence of interference due to static electricity upon signals flowing in a the test terminal 523 becomes reduced.

Also, the static electricity absorbing part 540 may not form an insulation coating. A coating agent, which insulates the upper surface of a printed circuit board pattern 520 formed on a substrate 510, may be formed. The static electricity absorbing part 540 may be formed by exposing a conductive thin film without an insulation coating. Also, the exposed conductive thin film may absorb static electricity.

Figure 2:
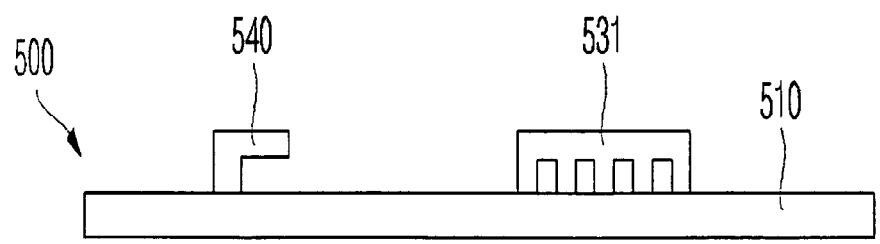
FIG. 2 is a side projection view of a protection circuit board according to another embodiment of the present invention.

Also, a conductor may be connected to a static electricity absorbing part 540 where no insulation coating is formed. The conductor may be attached to the static electricity absorbing part 540 by soldering or the like, of which various shapes may be made. If the structure of a conductor 14 is formed long in the direction where static electricity is abundant, a large amount of static electricity can be absorbed. For example, referring FIG. 2, a conductor is prepared in the static electricity absorbing part 540 formed on one surface of the protection circuit board 500. Since the conductor is located in the direction of a length of the protection circuit board 500, the size absorbing static electricity being introduced from the outside becomes wider.

Also, a conductor may be made of any one material selected from Cu, Al, Ni and stainless steel. If Cu is used as in the printed circuit board pattern being generally used, it is beneficial for the insulation substrate 510 and the printed circuit board pattern 520 to be formed at the same time. Also, if a material such as Al, Ni and stainless steel is plated on the printed circuit board pattern 520, an increase of surface resistance of the static electricity absorbing part 540 due to oxidization or corrosion can be prevented.

Also, the conductor may be made of a conductive paste. The conductive paste is formed by mixing a conductive powder and an adhesive component. The conductive paste may be coated on the static electricity absorbing part 540. This method makes the process very simple, and helps the conductive paste to be widely coated, or coats the conductive paste even to the surface where no printed circuit board pattern 520 is formed so that a greater amount of static electricity can be absorbed. The upper surface of a protection circuit board excepting the static electricity absorbing part 540 may be coated with an insulator.

Figure 3:
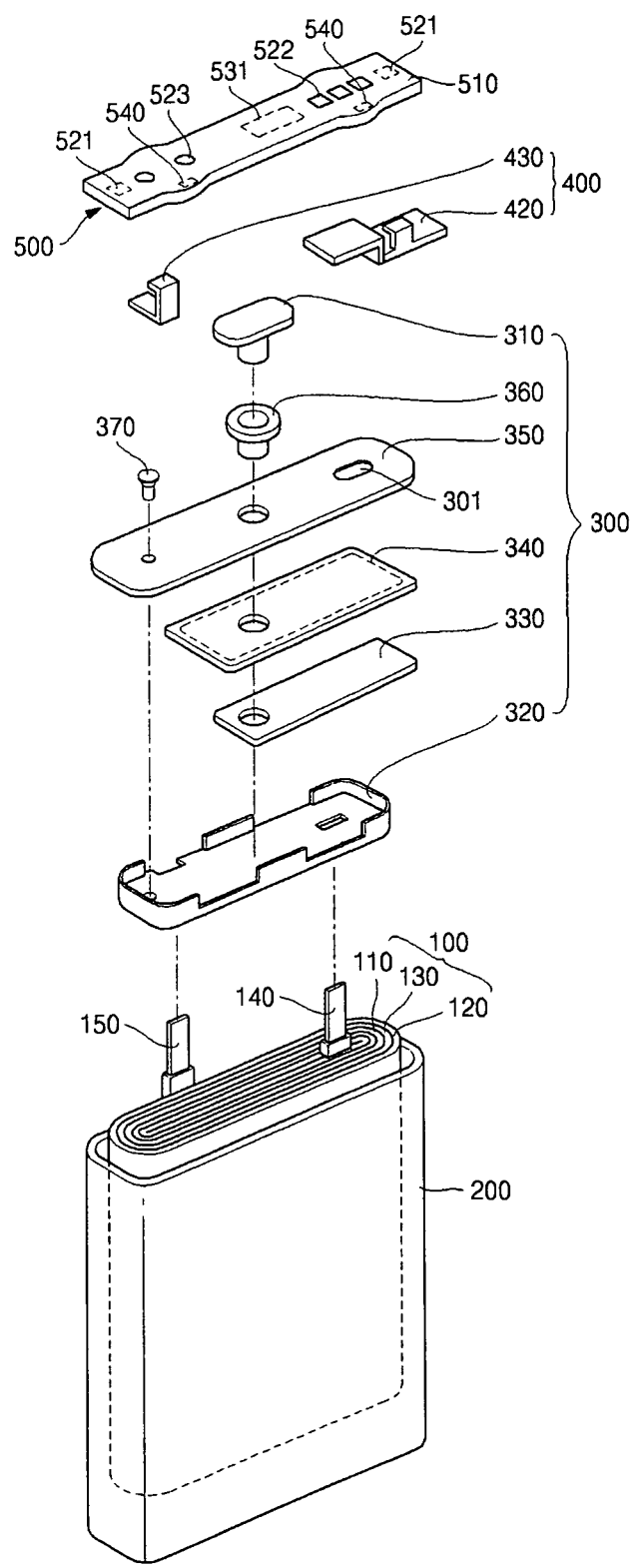
FIG. 3 is an exploded perspective view of a secondary battery in a state before a resin molding part is not formed around the protection circuit board according to the embodiment of the present invention".

Referring to FIG. 3, a secondary battery of the present invention using a protection circuit board for a secondary battery includes an electrode assembly 100, in which an anode plate 110 connected to an anode tap 150, a cathode plate 120 connected to a cathode tap 140 and a separator 130 interposed between the anode plate 110 and the cathode plate 120 are deposited; a can 200, of which one end part accepting the electrode assembly 100 is open; a cap assembly 300 including an electrode terminal 310 electrically connected the cathode tap 140 and a cap plate 350 closing the opening part of the can 200 and electrically connected to the anode tap 150; a lid electrode part 400 electrically connected to the electrode terminal 310 and the cap plate 350; and a protection circuit board 500 including an insulation substrate 510, a printed circuit board pattern printing an electrode tap connection terminal 521 mounted on the insulation substrate 510 and electrically connected to the lid electrode part 400, a charge/discharge terminal 522 and a printed circuit board, a passive element including a plurality of resistors connected to the printed circuit board pattern and a capacitor, a protection circuit 531 connected to the printed circuit board pattern and a static electricity absorbing part 540 of which at least a part of the printed circuit board pattern encloses the periphery.

An electrode assembly 100 is formed in such a manner that an anode plate 110 equipped with an anode tap 150 and a cathode plate 120 equipped with a cathode tap 140 and a separator 130 are deposited and wound.

The anode plate 110 consists of an anode collector and an anode active material layer. The anode active material layer may consist of a lamellar compound including Li, a binder improving the binding force and a conductive material improving conductivity. Generally, the anode collector uses Al and is the pathway of electric charges generated by the anode active material layer and supports the anode active material layer. The anode active material layer is attached to wide surfaces of an anode collector, and an uncoated anode part (not shown), where no anode active material layer is formed, is arranged on one side of the anode plate. An anode tap 150 is attached to the uncoated anode part 150.

A cathode plate 120 consists of a cathode collector and a cathode active material. The cathode active material contains carbon and may be made of hard carbon, which is frequently used, or graphite, and a binder improving the binding force between active material particles. Generally, the cathode collector uses Cu and is the pathway of electric charges generated by the cathode active material layer and supports the cathode active material layer. The cathode active material layer is formed on the wide surface of a cathode plate 120. An uncoated cathode part (not shown), where no cathode active material layer is formed, is arranged on one side of the cathode plate 120. A cathode tap 140 is attached to the uncoated cathode part.

A separator 130, which is interposed between an anode plate 110 and a cathode plate 120, insulates the anode plate 110 from the cathode plate 120 and passes electric charges of the anode plate 110 and the cathode plate 120. Generally, the separator 130 is made of polyethylene PE or polypropylene PP. However, the present invention is not limited thereto. The separator 130 may include an electrolyte and be a liquid or a gel.

The anode tap 150 and cathode tap 140 electrically connect the electrode assembly 510 to the electrical terminal not shown of an external appliance. They are attached to the uncoated anode part of an anode plate 110 or the uncoated cathode part of a cathode plate 120. Generally, Al or an Al alloy or Ni or a Ni alloy is respectively, used for the anode tap 150 and the cathode tap 140. However, the present invention is not limited thereto.

The can 200 accepts the electrode assembly 100 and has an opening part. Considering the shape of an electrode assembly 510, the can 200 is formed as a square or rectangular shape. After accepting an electrode assembly 100, the can 200 accepts an electrolyte. The can 200, which has accepted the electrode assembly 100, accepts an insulation case 320 in the internal side, and is then sealed by welding or thermal bonding to a cap plate 350 of a cap assembly 300. The material of the can 200 is usually Al. However, the present invention is not limited thereto.

The cap assembly 300 includes the electrode terminal 310 which electrically connects the cathode tap 140 of the electrode assembly 100 to a cathode lid plate 420 and which is arranged in a center hole 358 of the cap plate 350 along with an insulation gasket 360, an insulation case 320, which is arranged on the upper side of the electrode assembly 100, is accepted in the can 200, a terminal plate 330 which joins the end part of the electrode terminal 310 and is electrically connected thereto, an insulation plate 340 which separates the terminal plate 330 from the cap plate 340 and has a center hole 342 for connection of the electrode terminal 310 to the terminal plate 330, a cap plate 350 which has a hole 358 for injecting an electrolyte, the electrode terminal 310 and a safety vent 301 closes the opening part of the can, an insulation gasket 360 which encloses the body part of the electrode terminal 310 to separate the cap plate 350 from the electrode terminal 310, and an electrolyte injection hole tap 370 which seals the electrolyte injection hole of the cap plate 350.

Figure 4:
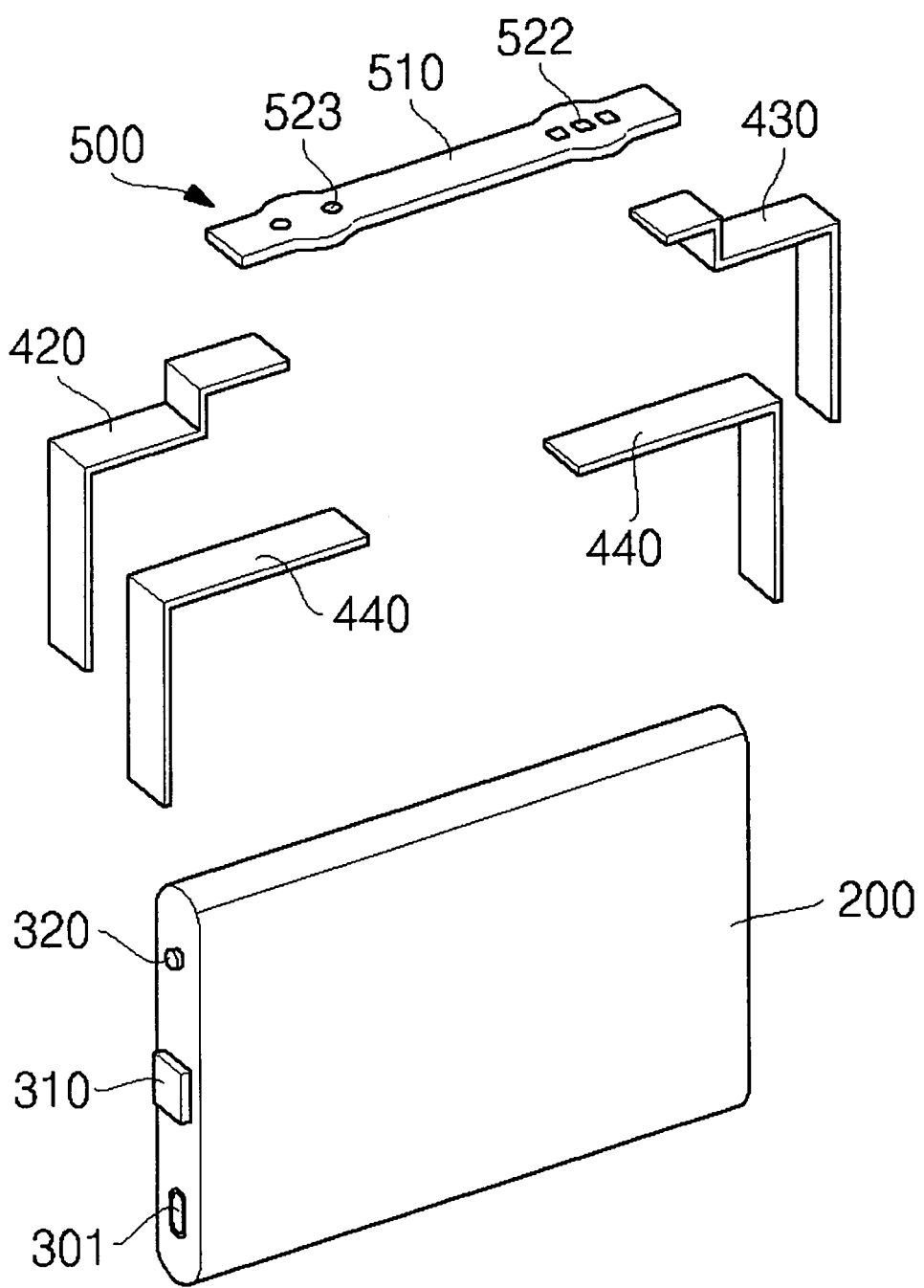
FIG. 4 is an exploded perspective view of an assembled can, which accepts a cap assembly and an electrode assembly, a protection circuit board and a lid electrode part according to still another embodiment of the present invention.

A lid electrode part 400 includes a cathode lid electrode 420 which is electrically connected to electrode terminal 310 and an anode lid electrode 430 which is electrically connected to cap plate 350. The cathode lid electrode 420 may be insulated by coating so as not to be shorted to the cap plate 350. The other end parts of the lid electrode part 400 are electrically connected to the electrode connection part 521 of a protection circuit board 500. The lid electrode part 400 is not confined to the configuration illustrated in the drawings. For example, referring to FIG. 4, the protection circuit board 500 may be formed on the lateral of a can 200. Since the lid electrode part 400 is electrically connected to the protection circuit board 500, the cathode lid electrode 420 of the lid electrode part 400 is simultaneously connected to the electrode terminal 310 and the anode lid electrode 430 is connected to the bottom of the can 200. An insulator 440 is interposed between the lid electrode part 400 and the can 200 so as to prevent shorting.

The protection circuit board 500 is electrically connected to the lid electrode part 400. A further description of the protection circuit board 500 is included above and is not repeated here.

Figure 5:
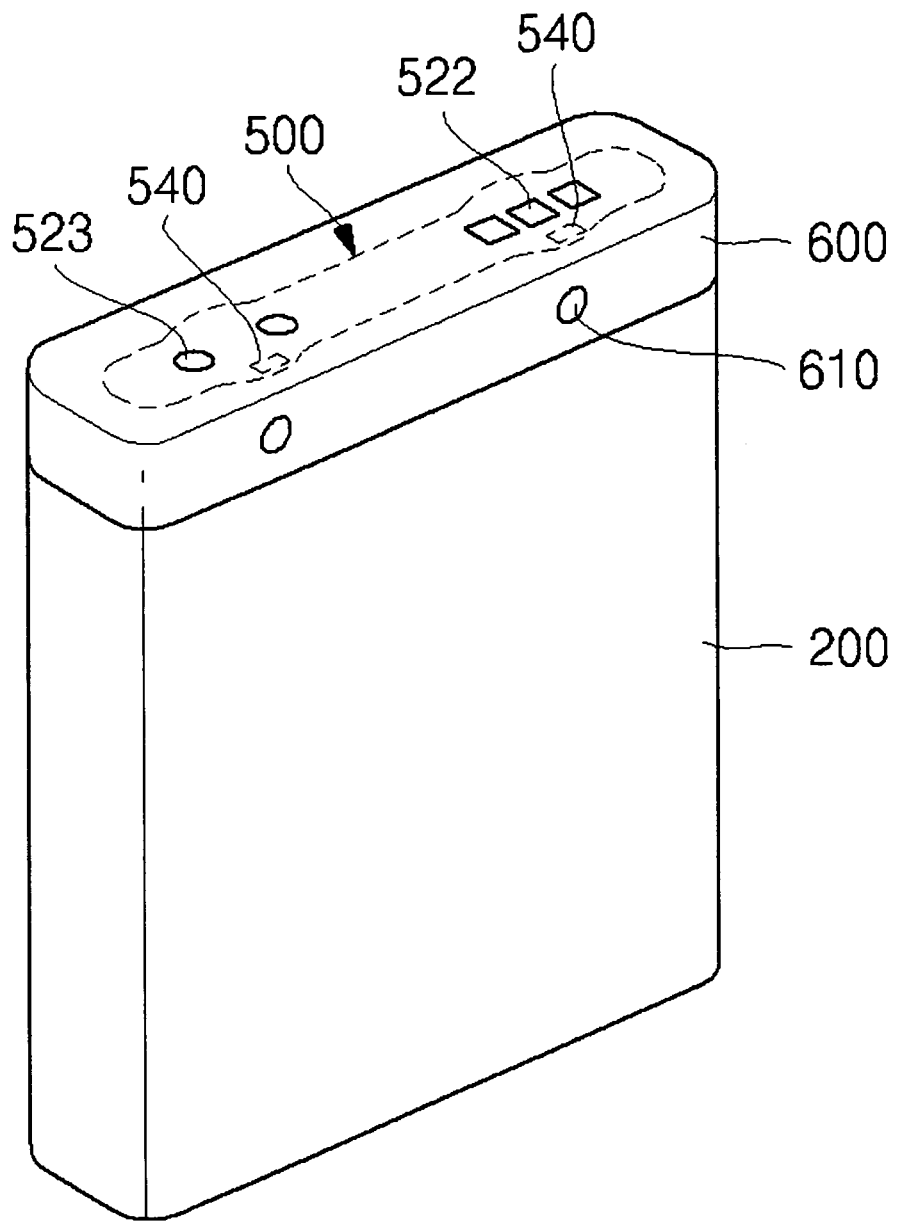
FIG. 5 is a perspective view of a secondary battery in a state after a resin molding part is formed in the secondary battery of FIG. 3.

Referring to FIG. 5, a resin molding part 600 is formed by molding the protection circuit board 500 with a melting resin. The resin molding part 600 is formed by putting the protection circuit board 500 in a mold (not shown) and molding it with a melting resin, or putting a can 200 accepting an electrode assembly (not shown), of which one end is closed with a cap assembly (not shown), the protection circuit board 500 and a lid electrode part (not shown) in a mold and molding them with a melting resin. A minute gap is formed between a can 200 made of a metal and a resin molding part 600 during the process of the resin molding part 600. The gap provides a space for the flow of static electricity. A static electricity absorbing part (not shown) is formed within the space to absorb static electricity.

Also, the resin molding part 600 may be formed in such a manner that the terminal surface of a test terminal 523 is exposed. A voltmeter may be connected to the terminal surface of a test terminal 523 to determine whether or not the protection circuit board 500 is working normally by measured the test terminal 523 voltage.

Also, a hole 610, which passes from the external surface to the static electricity absorbing part 540, may be formed in the resin molding part. The hole 610 may be formed in a resin molding part 600 at the periphery of the protection circuit board 500. At least one hole may be formed in the resin molding part 600, which induces static electricity to be absorbed by the static electricity absorbing part 540. Accordingly, the introduction of static electricity into a protection circuit of the protection circuit board 500 or passive element or a positive element is prevented.

The present invention is not confined to the aforementioned descriptions regarding embodiments or drawings. Without departing from the gist of the present invention, one of ordinary skill in the art can practice various changes and modifications of the present invention.

The protection circuit board for a secondary battery of the present invention has a static electricity absorbing part, thereby preventing the electric element or protection circuit from burning or melting due to static electricity.

Also, the static electricity absorbing power can be increased by attaching a conductor to the static electricity absorbing part.

Also, the static electricity absorbing power can be increased by forming the static electricity absorbing part broadly.

Also, the absorbed static electricity power can be dispersed by forming the ground pattern connected to the static electricity absorbing part widely.

Also, a secondary battery can include a static electricity absorbing part to absorb the static 11 electricity so as to protect the protection circuit board from the static electricity.

What is claimed is:

1. A protection circuit board for a secondary battery, comprising: an insulation substrate providing opposed major surfaces exhibiting a bow extending outwardly along a minor section of an edge of the major surfaces; a printed circuit board having a charge/discharge terminal and a test terminal, said printed circuit board pattern arranged on the major surfaces of the insulation substrate; a static electricity absorbing part arranged at the printed circuit board pattern; and a resin molding part, composed of resin, covering an entirety of the printed circuit board pattern with the exception of the charge/discharge terminal and the test terminal and overlapping the protection circuit board forming a side wall to which a can is attached, said resin molding part having a hole in said side wall passing through to the static electricity absorbing part, the static electricity absorbing part and the hole being separate from the charge/discharge terminal and the test terminal, and a conductor attached to the static electricity absorbing part by soldering.

2. A protection circuit board as claimed in claim 1, wherein the static electricity absorbing part is arranged at a periphery of the printed circuit board pattern.

3. The protection circuit board as claimed in claim 1, wherein the static electricity absorbing part is coupled to a ground pattern of the printed circuit board pattern.

4. The protection circuit board as claimed in claim 2, wherein an area of the ground pattern coupled to the static electricity absorbing part is enlarged.

5. The protection circuit board as claimed in claim 2, wherein a width of the insulation substrate corresponding to the static electricity absorbing part is enlarged to conform to the bow of the insulation substrate.

6. The protection circuit board as claimed in claim 1, further comprising an electrode connection part disposed on an end portion of the insulation substrate.

7. The protection circuit board as claimed in claims 5, wherein the test terminal and charge/discharge terminal are arranged on the insulation substrate, wherein the test terminal and charge/discharge terminal are disposed on an enlarged area of the insulation substrate corresponding to the enlarged width.

8. The protection circuit board as claimed in claim 1, wherein the conductor comprises one material selected from Cu, Al, Ni and stainless steel.

9. A secondary battery, comprising: an electrode assembly; a can receiving the electrode assembly; a cap assembly including an electrode terminal and a cap plate electrically coupled to the electrode assembly; a protection circuit board having a charge/discharge terminal and a test terminal, said protection circuit board including an insulation substrate which has opposed major surfaces exhibiting a bow extending outwardly along a minor section of an edge of the major surfaces, a printed circuit board pattern arranged on the insulation substrate and a static electricity absorbing part arranged at the printed circuit board pattern; and a lead electrode part electrically connecting the electrode assembly to the protection circuit board; and a resin molding part, composed of resin, covering an entirety of the printed circuit board pattern with the exception of the charge/discharge terminal and the test terminal and overlapping the protection circuit board forming a side wall to which the can is attached, said resin molding part having a hole in said side wall passing through to the static electricity absorbing part, the static electricity absorbing part and the hole being separate from the charge/discharge terminal, and a conductor attached to the static electricity absorbing part by soldering.

10. The secondary battery as claimed in claim 9, wherein:
the can comprises a short side and a long side; and
the protection circuit hoard is disposed on the long side of the can.

11. The secondary battery as claimed in claim 10, further comprising an insulator disposed between the lead electrode part and the can.

12. The secondary battery as claimed in claim 9, wherein the static electricity absorbing part is arranged at a periphery of the printed circuit board pattern.

13. The secondary battery as claimed in claim 9, wherein the static electricity absorbing part is coupled to a ground pattern of the printed circuit board pattern.

14. The secondary battery as claimed in claim 13, wherein an area of the ground pattern coupled to the static electricity absorbing part is enlarged.

15. The secondary battery as claimed in claim 13, wherein a width of the insulation substrate corresponding to the static electricity absorbing part is enlarged to conform to the bow of the insulation substrate.

16. The secondary battery as claimed in claim 15, wherein the test terminal and the charge/discharge terminal are arranged on the insulation substrate, wherein the test terminal and the charge/discharge terminal are disposed on an enlarged area of the insulation substrate corresponding to the enlarged width.

\* \* \* \* \*